United States Patent
Ko et al.

(10) Patent No.: US 7,226,839 B1
(45) Date of Patent: Jun. 5, 2007

(54) METHOD AND SYSTEM FOR IMPROVING THE TOPOGRAPHY OF A MEMORY ARRAY

(75) Inventors: King Wai Kelwin Ko, San Jose, CA (US); Hiroyuki Kinoshita, Sunnyvale, CA (US); Hiroyuki Ogawa, San Jose, CA (US); Yu Sun, Saratoga, CA (US)

(73) Assignee: Spansion LLC, Sunnyvale, CA (US)

(*) Notice: Subject to any disclaimer, the term of this patent is extended or adjusted under 35 U.S.C. 154(b) by 262 days.

(21) Appl. No.: 10/861,575

(22) Filed: Jun. 4, 2004

(51) Int. Cl.
*H01L 21/8234* (2006.01)

(52) U.S. Cl. ............... 438/257; 438/275; 438/294; 438/926

(58) Field of Classification Search ........... 438/926
See application file for complete search history.

(56) References Cited

U.S. PATENT DOCUMENTS

| | | | |
|---|---|---|---|
| 5,789,313 A * | 8/1998 | Lee ................... | 438/599 |
| 5,946,563 A * | 8/1999 | Uehara et al. ........... | 438/183 |
| 6,717,267 B1 * | 4/2004 | Kunikiyo ............... | 257/758 |
| 2002/0050655 A1 * | 5/2002 | Travis et al. ............ | 257/798 |
| 2003/0015742 A1 * | 1/2003 | Ogawa et al. ........... | 257/296 |

* cited by examiner

Primary Examiner—Stephen W. Smoot

(57) ABSTRACT

A method and system for improving the topography of a memory array is disclosed. In one embodiment, a dummy bitline is formed over a field oxide region at an interface between a memory array and interface circuitry. In addition, a poly-2 layer is applied above the dummy bitline on the field oxide region wherein the utilization of the field oxide region for placement of the dummy bitline provides a uniform surface between an actual bitline and the periphery of the memory array. Furthermore, a landing pad is formed at the end of the dummy bitline on the field oxide region, wherein the dummy bitline does not cause erroneous operation of the landing pad.

12 Claims, 4 Drawing Sheets

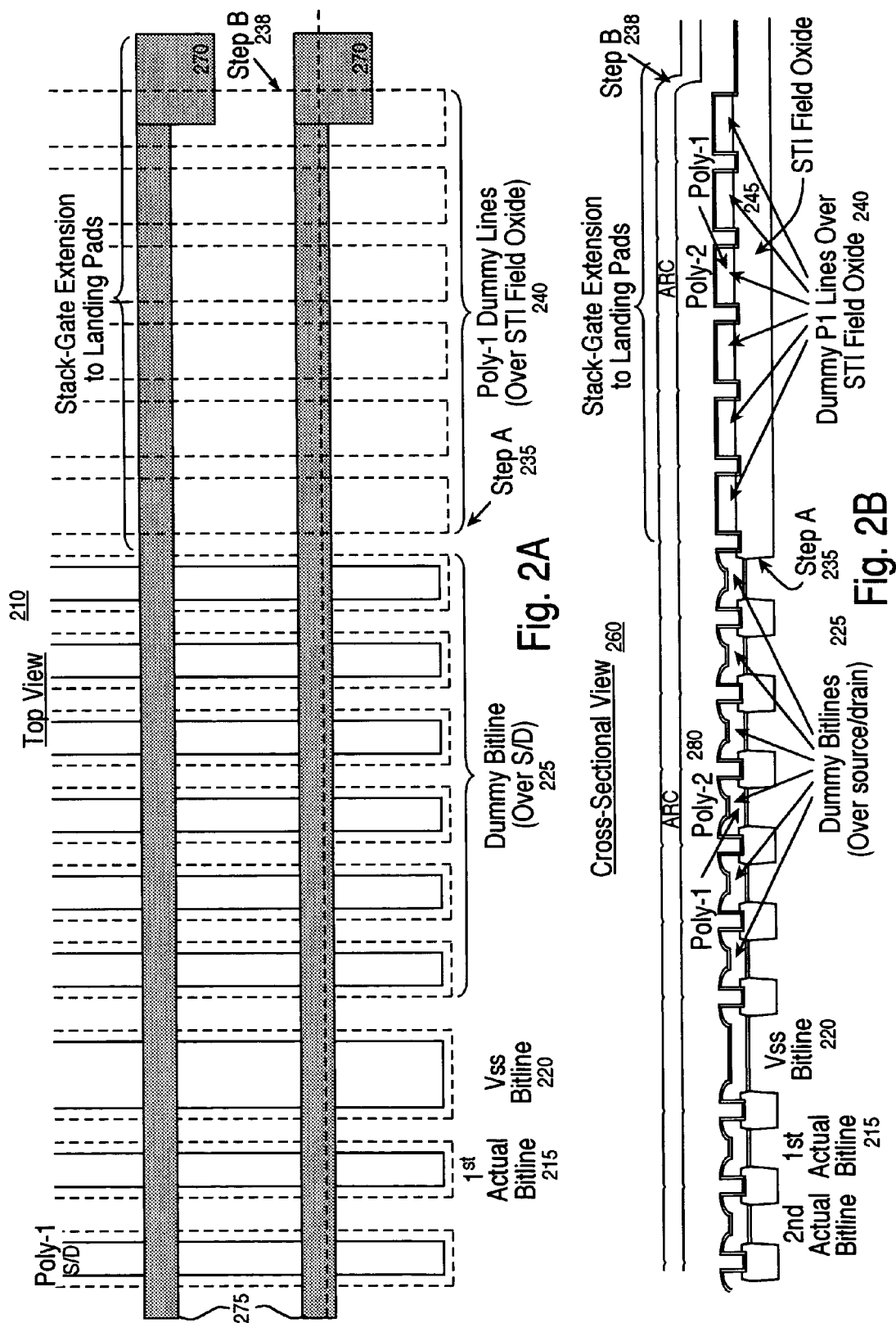

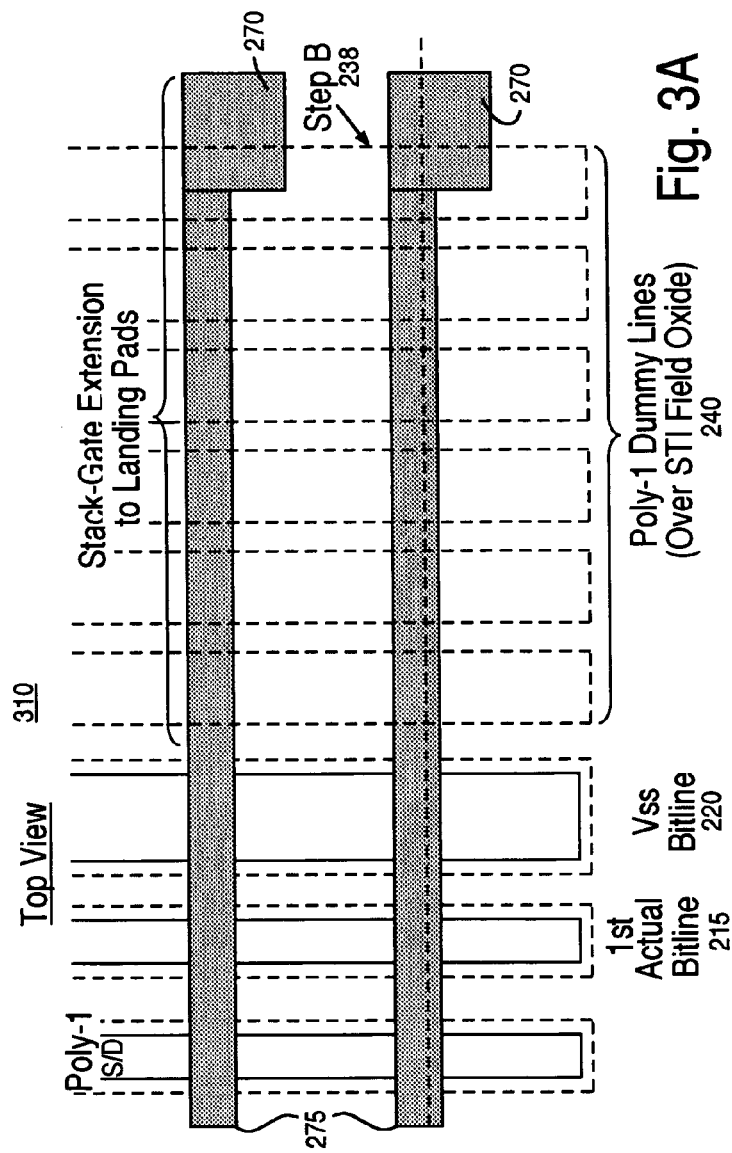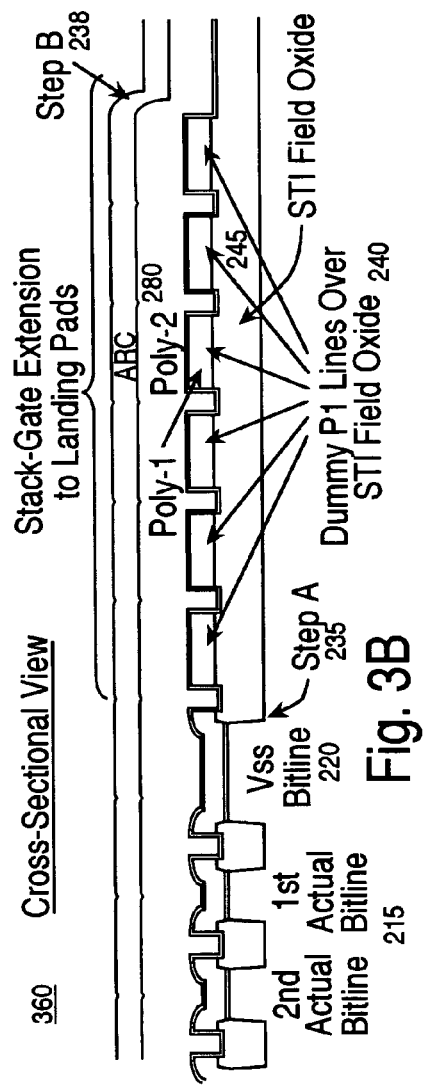

METHOD AND SYSTEM FOR IMPROVING THE TOPOGRAPHY OF A MEMORY ARRAY

FIELD OF THE INVENTION

The present invention relates to the field of floating gate devices. Specifically, the present invention relates to improving the topography of a memory array.

BACKGROUND ART

A modern integrated circuit (IC), for example a flash memory device, may have millions to hundreds of millions of devices made up of complex, multi-layered structures that are fabricated through hundreds of processing steps. Those structures are formed by repeated deposition and patterning of thin films on a silicon substrate, also known as a wafer.

As device size shrinks, interfaces between operational components and periphery components also shrink. Although the shrinking of devices is important to the industry, a plurality of trouble spots begin to appear as portions of the device move closer together. For example, at the boundary between operational and non-operational devices, errors can occur due to the plurality of processes involved in manufacturing. For example, in a memory array there are a plurality of actual bitlines that are formed through layering, masking, and etching processes. At the edges of the memory array (e.g., the last couple of bitlines before the edge of the memory array), the masking processes may be less controllable due to changes in the topography of the underlying layers and/or pattern density. This is due to overspray, underspray, excess material application, lack of material application, or the like which may result in a loss of uniformity at the periphery.

To ensure quality of the memory device, most manufacturing processes incorporate an amount of space at the periphery or transitional points known as dummy space. Specifically, these are sections of manufacture that have high rates of error during the manufacturing process. Therefore, instead of trying to ensure each and every device is perfect and/or operationally sound, a manufacturer will just set a standard number (e.g., the last four or five) of lines of devices in a process that will be treated as throw away, non-operational (e.g., dummy) spaces. These spaces may have any or all of the manufacturing process performed thereon, however, they will be assumed to be flawed and treated as such.

Another solution to the loss of components on the edge of a memory array manufacturing process is to utilize the dummy space as a stand off for conformity and operational issues. For example, instead of cutting out the dummy space they may be used as a buffer zone against other manufacturing operations that will occur later in the process.

For example, during the manufacture of a flash memory device, a plurality of dummy bitlines may follow the plurality of actual bitlines. However, by maintaining a buffer zone of dummy bitline components, the memory device also retains an unnecessarily larger profile. Therefore, although they are necessary as buffers during the manufacturing process, they ultimately hinder the ability to further reduce a component's size. Additionally, if the dummy bitlines are decreased in size, it is apparent that further dummy bitlines must be necessarily incorporated to retain the desired distance between active bitlines and the interface between a memory array and interface circuitry (e.g., the interface of the manufacturing process).

SUMMARY OF INVENTION

A method and system for improving the topography of a memory array is disclosed. In one embodiment, a dummy bitline is formed over a field oxide region at an interface between a memory array and interface circuitry. In addition, a poly-2 layer is applied above the dummy bitline on the field oxide region wherein the utilization of the field oxide region for placement of the dummy bitline and poly-2 layer provides a uniform surface between an actual bitline and the periphery of the memory array. Furthermore, a landing pad is formed at the end of the poly-2 lines above the dummy bitline on the field oxide region, wherein the dummy bitline does not cause erroneous operation of the landing pad.

BRIEF DESCRIPTION OF THE DRAWINGS

The accompanying drawings, which are incorporated in and form a part of this specification, illustrate embodiments of the invention and, together with the description, serve to explain the principles of the invention.

FIG. 2A is a diagram of the top view of a portion of the interface between a memory array and interface circuitry in accordance with an embodiment of the present invention.

FIG. 2B is a diagram of the cross-sectional view of a portion of the interface between a memory array and interface circuitry in accordance with an embodiment of the present invention.

FIG. 3A is a diagram of the top view of a portion of the interface between a memory array and interface circuitry in accordance with another embodiment of the present invention.

FIG. 3B is a diagram of the cross-sectional view of a portion of the interface between a memory array and interface circuitry in accordance with another embodiment of the present invention.

DETAILED DESCRIPTION OF THE INVENTION

Reference will now be made in detail to embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

The present invention provides a method and structure for improving the topography of a memory array. In one embodiment, poly one dummy lines are formed over the STI field oxide area where the stack-gate lines extend to the landing pads. This creates a new step on the topography of the memory array which is farther away from the actual bitline. Additionally, a much flatter topography for the stack-gate mask photoresist is formed which improves the critical dimension (CD) uniformity of the stack-gate mask close to the core array boundaries. Moreover, the number of dummy bitlines over the source-drain region may also be reduced. This reduction will result in a manufacturing savings due to less die area wasted while also maintaining enough distance between the first actual bitline and the step. Therefore, in one embodiment, the overall size of the core array can be reduced.

Figure 1:
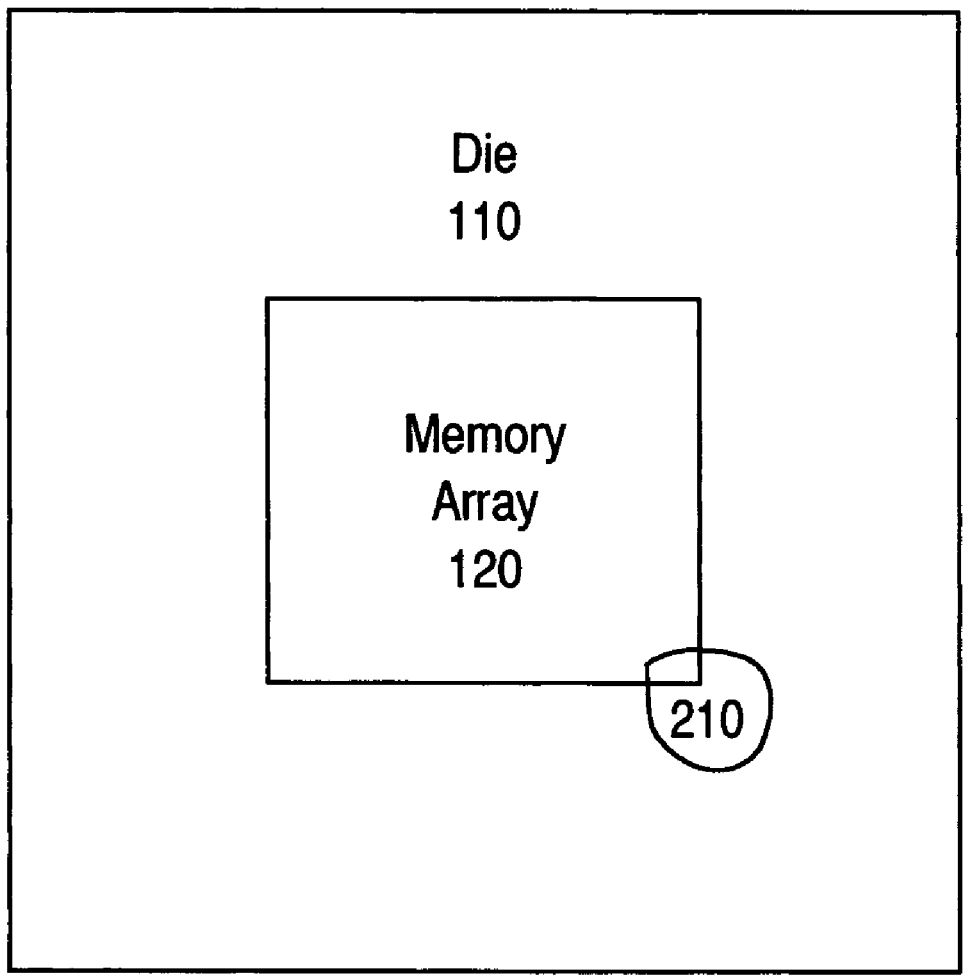
FIG. 1 is a block diagram of a memory device in accordance with an embodiment of the present invention.

FIG. 1 is a block diagram of a memory device in accordance with an embodiment of the present invention. Memory device 100 includes a die portion 110 and a memory array portion 120. In one embodiment, memory device 100 is a flash memory device. Die portion 110 may be a wafer material such as silicon on which the memory array 120 is manufactured. Furthermore, although only one memory array is shown on die 10, it is completely viable for there to be more than one memory array 120 being formed on die 110. In one embodiment, memory array 120 if manufactured in a flash memory process that is well known in the art. Included in the manufacture of memory array 120 may be source-drain portions, poly one and poly-2 layers, tunnel oxide, silicon, field oxide, and the like. In addition, interface area 210 of FIG. 1, which is better illustrated in FIGS. 2A, 2B, 3A and 3B includes bitlines, stack-gate extension, landing pads, and the like.

With reference now to FIGS. 2A and 2B, diagrams of the top and cross-sectional views of a portion of the interface between a memory array and interface circuitry are shown in accordance with an embodiment of the present invention. Specifically, FIG. 2A illustrates a close up of the interface area 210 of memory device 100 from the top view and FIG. 2B illustrates a close up of the interface area 210 of memory device 100 from the cross-sectional view.

FIGS. 2A and 2B include actual bitlines 215, Vss bitlines 220, dummy bitlines over source-drain region 225, dummy bitlines over field oxide region 240, and stack gate extension landing pads 270. In general, there may be several thousand actual bitlines 215 throughout the memory array 120 of FIG. 1. Additionally, there may be a plurality of interface circuitry acting as control logic for the memory array 120.

In one embodiment, the only difference between the first actual bitline 215 and the dummy bitlines over the source-drain 225 is that the first actual bitline 215 is the first real memory device being used by the memory array 120. The dummy bitlines over the source-drain 225 are manufactured to the same standard as the actual bitline 215 but are not used. Instead, the dummy bitlines over the source-drain 225 are used to maintain the topography of the poly-2 layer 280 and to absorb any manufacturing errors occurring at the periphery of the device.

However, the dummy bitlines over the field oxide 240 are not manufactured to the same standards as the actual bitline 215 or the dummy bitlines over the source-drain 225. Instead, the dummy bitlines over the field oxide 240 are manufactured in a simplified process that does not include a source drain region, and does include only etching of the poly one layer. For example, the dummy bitlines over the source-drain 225 are manufactured as, and may be used as, actual bitlines 215. However, the dummy bitlines over the field oxide 240 could not ever be used as actual bitlines 215. They are non-operational filler used to maintain the topography of the memory array 120 as well as ensuring that any edge painting errors occur on "dummy" space not on any actual devices. In one embodiment, there may be any number of the dummy bitlines over the field oxide 240 and/or the dummy bitlines over the source-drain 225. The numbers of dummy bitlines shown in FIGS. 2A and 2B are merely one embodiment shown for purposes of clarity.

The utilization of the dummy bitlines over the field oxide 240 is a great step forward in the manufacturing process of memory devices. Furthermore, due to the placement of the dummy bitlines over field oxide 240 many or all of the dummy bitlines over the source-drain 225 may be removed (as shown in FIGS. 3A and 3B). Therefore, the size of the memory array 120 in particular, and the memory device in general, may be reduced by the amount of space saved with the reduction of the dummy bitlines over the source-drain 225.

With reference still to FIGS. 2A and 2B, due to the manufacture of the dummy bitlines over the field oxide 240, the topography of memory array 120 is maintained until step B 238. By maintaining the topography of the memory array, CD uniformity problems including problems resulting from the stack-gate masking process are reduced. This is important especially during the printing of the stack-gate 275. For example, as the device size shrinks, the stack-gate 275 shrinks, therefore, any non-uniformity in the topography will result in non-uniform electric trace 275 line width. If the line width of stack-gate 275 is poorly formed, then the control of the actual bitline 215 becomes very poor and adversely affects the first actual device and the entire memory array.

In the memory device, it is important that there is a portion of the memory array 120 that has only field oxide 245 and not any silicon or source-drain structures directly thereunder. The field oxide 245 is used as the area for forming and utilizing landing pads 270. In one embodiment, landing pads 270 are used for receiving the contacts that allow operation of the memory device after manufacture. For example, the contacts that are connected with the landing pads 270 and relatively high voltage passes through the contacts at the connection with the landing pads 270. Therefore, if the landing pads 270 were over silicon or source-drain structures sapping (or tunneling) may occur. Therefore, the landing pads 270 must remain over field oxide 240 and a portion of the memory array 120 must include a portion of field oxide 240.

Referring still to FIGS. 2A and 2B, in one embodiment, since the landing pad-contact area is necessary (e.g., STI field oxide 245), the manufacturing process is adjusted so that the dummy bitlines are formed over the field oxide 240 in addition to being formed over the source-drain region 225. In addition, the layer of poly-2 280 maintains good planarity at step A 235. Therefore, the topography of the memory array 120 is uniformly maintained all the way to step B 238 which, as stated herein, is important for the CD control during the stack-gate formation. Thus, by utilizing the STI field oxide 245 portion of the memory array 120 to increase the distance between the first actual bitline 215 and the step B 238, the number of dummy bitlines over the source-drain 225 may also be reduced. This reduction would also provide an opportunity for further size reduction of the memory device 100 of FIG. 1.

With reference now to FIGS. 3A and 3B, diagrams of the top and cross-sectional views of a portion of the interface between a memory array and interface circuitry are shown in accordance with another embodiment of the present invention. Specifically, FIG. 3A illustrates a close up of the interface area 210 of memory device 100 from the top view and FIG. 3B illustrates a close up of the interface area 210 of memory device 100 from the cross-sectional view.

FIGS. 3A and 3B include actual bitlines 215, Vss bitlines 220, dummy bitlines over field oxide region 240, and stack gate extension landing pads 270. In general, there may be several thousand actual bitlines 215 throughout the memory array 120 of FIG. 1. Additionally, there may be a plurality of interface circuitry acting as control logic for the memory array 120. In general, FIGS. 3A and 3B are similar to that of FIGS. 2A and 2B except FIGS. 3A and 3B illustrate the embodiment wherein the dummy bitlines over the source-drain 225 have been completely removed. That is, the dummy bitlines begin over the filed oxide 245 instead of over the source-drain region. In one embodiment, FIGS. 3A and 3B are embodiments of the absolute reduction of the dummy bit lines over the source-drain 225. In another embodiment, there may be any number of dummy bit lines over the source-drain 225.

Figure 4:
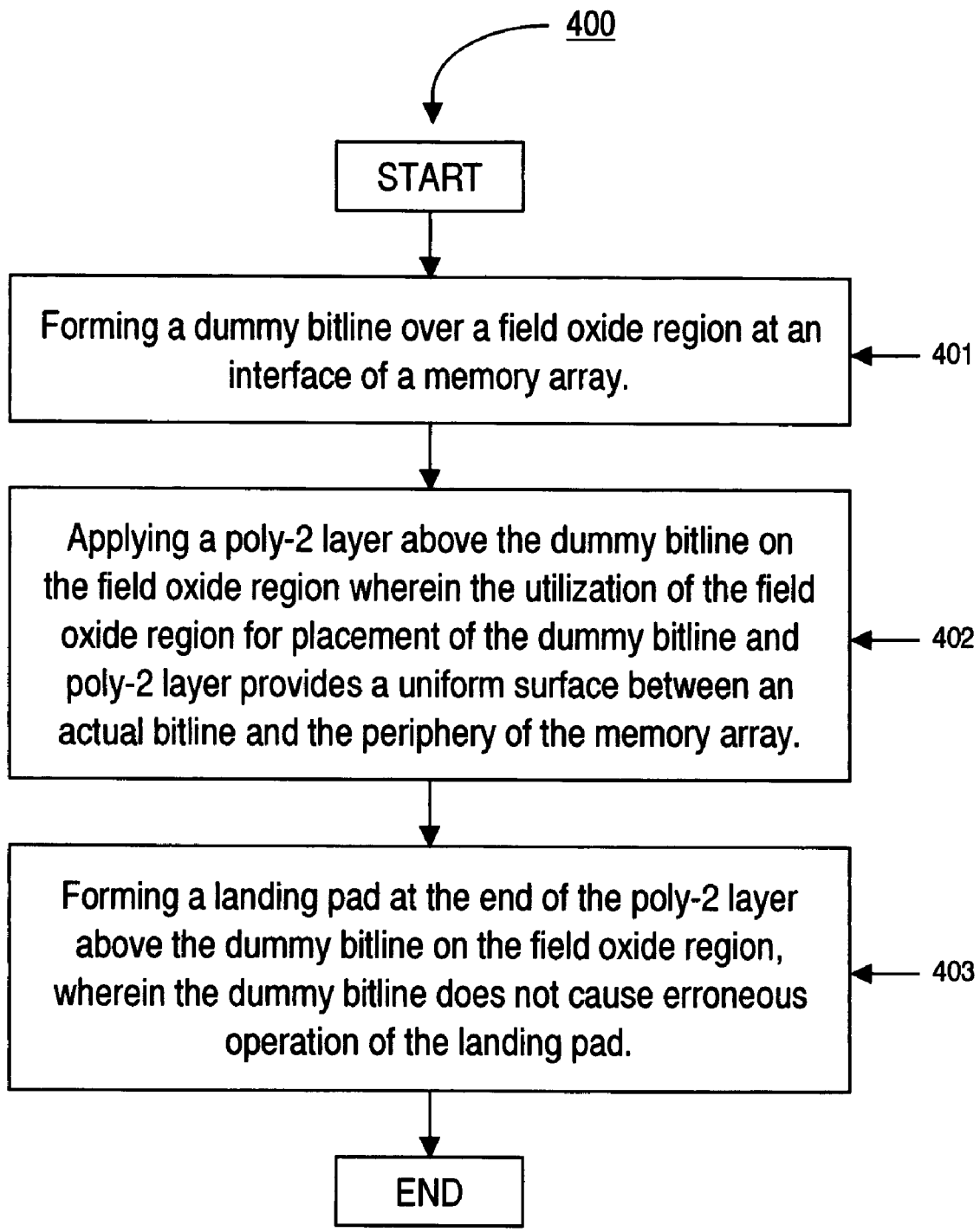
FIG. 4 is a flowchart of steps performed in accordance with one embodiment of the present invention for improving the topography of a memory array.

With reference now to FIG. 4, a flowchart of steps performed in accordance with one embodiment of the present invention for improving the topography of a memory array is shown. Specifically, FIG. 4 is a flow diagram of an exemplary process 400 for modifying the manufacturing process of a memory device to allow for reduced size without adding additional manufacturing steps to the process.

With reference now to step 401 of FIG. 4 and to FIG. 2, in one embodiment a dummy bit line is formed over a field oxide region 240 at a interface 210 of a memory array 120. In general, the memory array 120 may include a plurality of actual bitlines 215 in the center portion and a plurality of dummy lines at the interface. As described in detail herein, the dummy bit line formed over a field oxide region 240 are formed using the same processing steps for forming the poly one layer over the actual bitline in the rest of the memory array 120.

With reference now to step 402 of FIG. 4 and to FIG. 2, in one embodiment a poly-2 layer 280 is applied above the dummy bitline on the field oxide region 240. In one embodiment, the utilization of the field oxide region 245 for placement of the dummy bitline and poly-2 layer provides a uniform surface between an actual bitline and the periphery of the memory array 120. As described herein, the uniform topography above the memory array 120 is important in construction of the stack gate lines 275. In one embodiment, the formation of the poly-2 layer 280 above the field oxide 245 is performed in conjunction with the formation of the poly-2 layer 280 above the source drain region.

With reference now to step 403 of FIG. 4 and to FIG. 2, in one embodiment a landing pad 270 is formed above the dummy bitline on the field oxide 240 region. In one embodiment, the poly-2 layer 280 and the dummy bitline on the field oxide 240 region do not cause erroneous operation of the landing pad 270 or the connectors coupled therewith.

A beneficial consequence of utilizing the field oxide region 245 for improving the topography of the memory array 120 is the reduction of dummy bitlines over the source-drain 225 thereby reducing the overall size of the memory array 120. For example, for every simple dummy bitline formed over the field oxide 245 region, a complex dummy bitline manufactured over the source-drain region can be removed. Therefore, in one embodiment, manufacturing costs are reduced. In addition, the overall amount of wasted or dummy space on the memory device is also reduced.

Thus, the present invention provides, in various embodiments, a method and system for improving the topography of a memory array. Furthermore, the present invention provides a method and system for improving the topography of a memory array that works with reduced memory device sizes. Additionally, the present invention provides a method and system for improving the topography of a memory array which meets the above needs and which is compatible with existing memory manufacturing processes.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method for improving the topography of a memory array comprising:

forming a dummy bitline over a field oxide region at an interface between a memory array and interface circuitry;

applying a poly-2 layer above the dummy bitline on the field oxide region wherein the utilization of the field oxide region for placement of the dummy bitline and poly-2 layer provides a uniform surface between an actual bitline and the periphery of the memory array; and forming a landing pad at an end of the poly-2 layer above the dummy bitline on the field oxide region, wherein the dummy bitline does not cause erroneous operation of the landing pad.

2. The method as recited in claim 1 wherein the memory array comprises a plurality of actual bitlines in a central region of said memory array and a plurality of dummy bitlines at an interface region of said memory array.

3. The method as recited in claim 1 wherein the landing pads are formed above the field oxide region having no source-drain portion thereunder to prevent sapping of current through said memory array.

4. The method as recited in claim 1 wherein a number of dummy bitlines not on the field oxide region may be reduced without adversely affecting the uniform surface of the memory array.

5. The method as recited in claim 1 wherein reducing a number of dummy bitlines not on the field oxide region reduces the overall size of the memory array.

6. The method as recited in claim 1 wherein the uniform surface for performing a stack-gate mask process provides a critical dimension (CD) conformity for the memory array.

7. The method as recited in claim 1 further comprising: performing a stack-gate mask process above the poly-2 layer over the dummy bitline formation.

8. The method as recited in claim 7 wherein the CD uniformity of the stack gate lines over the actual bitlines of the memory array is improved during the stack-gate mask process.

9. A method for improving the topography of a memory array comprising:

forming a dummy bitline over a field oxide region at an interface between a memory array and interface circuitry having actual bitlines;

applying a poly-2 layer over the dummy bitline on the field oxide region, wherein the addition of the dummy bitline over the field oxide region provide a uniform surface for performing a stack-gate mask process with better CD control of the stack-gate lines over the actual bitlines; and forming one or more landing pads at an end of the field oxide region, wherein the landing pads are formed over the dummy bitline having no source-drain portion thereunder.

10. The method as recited in claim 9 wherein the dummy bitline is formed on the field oxide region having no source-drain thereunder.

11. The method as recited in claim 9 wherein the landing pads are formed on the dummy bitline over the field oxide region having no source-drain portion thereunder to ensure that sapping does not occur.

12. The method as recited in claim 9 wherein a number of dummy bitlines not on the field oxide region may be reduced without adversely affecting the planarity of the interface for performing a stack-gate mask process with better CD control of the stack-gate lines over the actual bitlines.

* * * * *